US008419965B1

(12) United States Patent
Nemeth et al.

(10) Patent No.: US 8,419,965 B1
(45) Date of Patent: Apr. 16, 2013

(54) SYSTEM AND METHOD FOR TEXTURING GLASS

(75) Inventors: Paul R. Nemeth, Springville, IA (US); John W. Sackfield, Marion, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 673 days.

(21) Appl. No.: 12/485,744

(22) Filed: Jun. 16, 2009

(51) Int. Cl.
*B44C 1/22* (2006.01)
(52) U.S. Cl.
USPC ............... 216/97; 216/98; 216/103; 438/753
(58) Field of Classification Search .................. 216/97, 216/98, 103, 108, 83, 99, 104; 438/745, 438/753, 7; 134/1.2
See application file for complete search history.

(56) References Cited

U.S. PATENT DOCUMENTS

| 5,127,930 | A | 7/1992 | Howorth | |
|---|---|---|---|---|
| 7,145,619 | B2* | 12/2006 | Sawasaki et al. | 349/129 |
| 7,889,284 | B1 | 2/2011 | Nemeth et al. | |
| 2002/0127432 | A1* | 9/2002 | Saito et al. | 428/694 SG |
| 2003/0170459 | A1* | 9/2003 | Lin | 428/410 |
| 2007/0082575 | A1* | 4/2007 | Shin et al. | 445/24 |
| 2009/0197048 | A1 | 8/2009 | Amin et al. | |

OTHER PUBLICATIONS

U.S. Appl. No. 12/286,006, filed Sep. 26, 2008, Barnidge et al.
U.S. Appl. No. 12/012,722, filed Feb. 5, 2008, Nemeth et al.
U.S. Appl. No. 12/485,744, filed Jun. 16, 2009, Nemeth et al.
The Electrochemical Society's Cleaning Technology in Semiconductor Device Manufacturing VI, 2000, vol. 99-36, 3 pages.
Office Action for U.S. Appl. No. 12/611,016, mail date May 4, 2012, 18 pages.
The Springer Handbook of Nanotechnology, 2nd Ed., Copyright 2004 & 2007, 3 pages.
Office Action for U.S. Appl. No. 12/611,016, mail date Dec. 10, 2012, 12 pages.

* cited by examiner

*Primary Examiner* — Lan Vinh
(74) *Attorney, Agent, or Firm* — Donna P. Suchy; Daniel M. Barbieri

(57) ABSTRACT

A method for texturing a glass substrate includes cleaning the glass substrate with at least one surfactant and etching the glass substrate using a caustic solution. The percentage of caustic solution is provided by controlling a fluid flow and temperature to control the depth of the etching. The method also includes acid cleaning the etched glass substrate to remove glass residuals and surfactants.

10 Claims, 4 Drawing Sheets

SYSTEM AND METHOD FOR TEXTURING GLASS

BACKGROUND

The present disclosure relates generally to the field of glass substrate etching or texturing. More specifically, the disclosure relates to systems and methods for etching or texturing thin glass substrates to reduce specular reflection.

Glass substrates (e.g., soda-lime glass, soda-lime silicate glass, alkali silicate glass, etc.) can be etched or textured to reduce specular reflectance and minimize diffuse reflectance while increasing haze. Conventional processes often use hydrofluoric or hydrochloric acid to etch the glass substrate. These conventional processes have difficulty etching thin soda-lime substrates (e.g., less than about 1 mm, less than about 0.7 mm, etc.) due to the aggressive nature of the acid. These acids (e.g., hydrofluoric acid or hydrochloric acid) are difficult to control without large reduction in glass mass, which can lead to poke-through points or a less durable substrate for example.

What is needed is a texturing system and method capable of etching a thin glass substrate to reduce specular reflectance and minimize diffuse reflectance while increasing haze without a large reduction in glass mass. What is also needed is a system and method for texturing a glass substrate in which the etching depth is highly controllable. What is further needed is a system and method for texturing a glass substrate using a more controllable agent. What is still further needed is a texturing system and method capable of etching a thin soda-lime or soda-lime silica glass substrate to reduce specular reflectance and minimize diffuse reflectance while increasing haze without a large reduction in glass mass.

SUMMARY

One embodiment of the invention relates to a method for texturing a glass substrate. The method includes cleaning the glass substrate with at least one surfactant and etching the glass substrate using a caustic solution. The level of texturing or etching is provided by controlling a fluid flow, a temperature, time, and a percent of caustic solution to control the depth of the etching. The method also includes adding acid to the etched glass substrate to remove glass residuals and neutralize caustic reactions.

Another embodiment of the disclosure relates to a glass substrate prepared by a process. The process includes cleaning the glass substrate with at least one surfactant and etching the glass substrate using a caustic solution. The level of texturing or etching is provided by controlling a fluid flow, a temperature, time, and a percent of caustic solution to control the depth of the etching. The process also includes adding acid to the etched glass substrate to remove glass residuals and neutralize caustic reactions.

Another embodiment of the disclosure relates to a substrate. The substrate includes at least one surface of soda-lime or soda-lime-silica glass having any thickness, specifically less than 0.7 millimeters. The at least one layer of glass is etched with a caustic solution and with an acid. The etched and cleaned glass has lower specular and diffuse reflectance than prior to etching and cleaning while maintaining light transmission.

DETAILED DESCRIPTION

Figure 1:
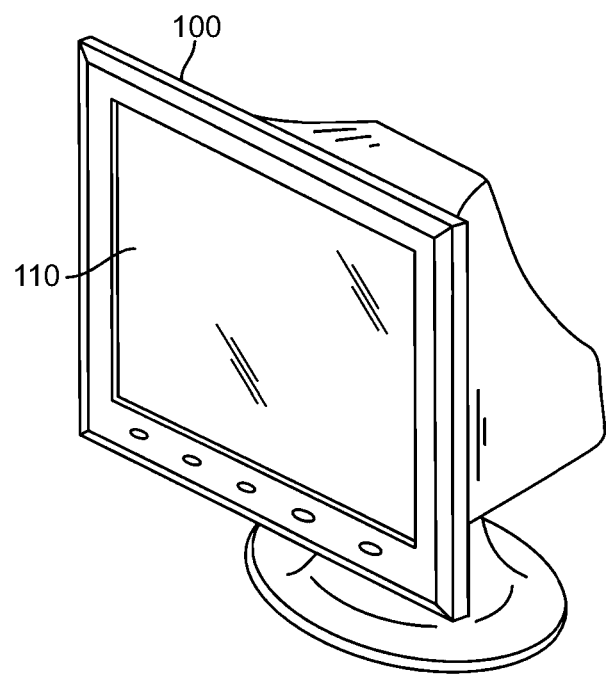
FIG. 1 is a perspective view of a display according to an exemplary embodiment.

Referring to FIG. 1, a display 100 (e.g., an electronic display) is configured to provide graphical and/or textual output to a user according to one exemplary embodiment. Display 100 includes a screen made of a glass substrate 110, for example soda-lime glass, soda-lime-silica glass, alkali-silicate glass, or any other type of glass. While display 100 is illustrated as a stand alone monitor or television, according to various other exemplary embodiments display 100 may be integrated or mounted in various locations such as in a vehicle (e.g., aircraft, automobile, marine vehicle, space vehicle, etc.). Display 100 can also be a military display, part of a heads-up display (HUD), a television, a liquid crystal display (LCD), an organic light emitting diode (OLED) display, an industrial display, a control panel (e.g., HVAC control, equipment control, etc.) display, a portable device (e.g., portable media player, PDA, cellular phone, etc.) display, etc. According to some exemplary embodiments, display 100 may include a touch screen feature capable of receiving user input, for example a resistive, capacitive, or inductive touch screen.

According to various exemplary embodiments, glass substrate 110 may be flexible, for example to facilitate touch screen input. While glass substrate 110 has been illustrated and described with reference to a display, according to other exemplary embodiments, glass substrate 110 may be used in other applications including, but not limited to, windows, solar panels, optics, picture frames, and containers. Glass substrate 110 may be textured or etched using a process or method as described below to reduce specular reflectance and minimize diffuse reflectance while increasing haze. The texturing may generally maintain a similar level of high transmission and high haze properties, for example to prevent or reduce image breakup on display 100. A textured surface ideally should not introduce anomalies or defects into glass substrate 110, for example causing delaminating of display 100, process flow patterns, moiré patterns in energized display 100, scintillation of energized display 100, etc. Glass substrate 110 may also be chemically strengthened according to any past, present, or future technology.

According to various exemplary embodiments, glass substrate 110 may be any thickness, for example greater than about 1 mm in thickness, less than about 1 mm in thickness, less than about 0.7 mm in thickness, less than about 0.5 mm in thickness, between about 0.1 and 1 mm in thickness, between about 0.3 and 0.7 mm in thickness, or between about 0.1 and 0.7 mm in thickness. Glass substrate 110 may be within any of these thickness ranges and be controllably textured using the processes and methods described below.

Figure 2:
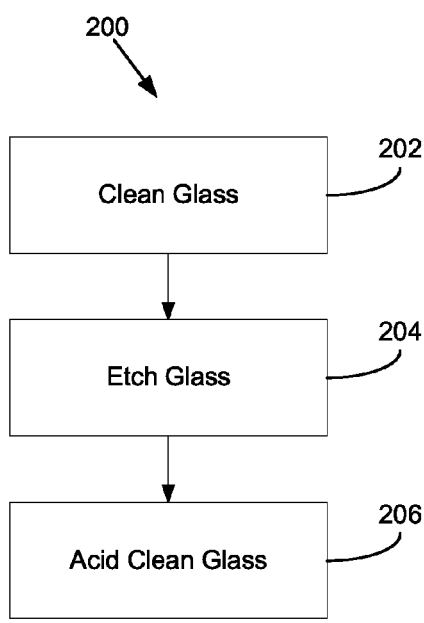
FIG. 2 is a flow chart of a glass texturing method or process according to an exemplary embodiment.

Referring to FIG. 2, process or method 200 for texturing or etching glass substrates (e.g., soda-lime-silica glass or soda-lime glass) is configured to reduce specular reflectance and minimize diffuse reflectance and to maintain high transmission and high haze (the component of reflection that provides "image break-up"), according to an exemplary embodiment. Method 200 is generally optically, mechanically, and thermally compliant with the laminated display assembly (e.g., display 100) such that anomalies or defects that would make the display objectionable are minimized, reduced, or not introduced. Examples of such anomalies include, delaminating of the display, process flow patterns, moiré patterns in the energized display, and or scintillation of the energized display. Method 200 may control the level of texturing, the degree of haze, specular and diffuse reflection, transmission, feature size, and/or surface roughness while minimizing the amount of substrate material loss during the etching process.

At a step 202, a cleaning process uses one or more surfactants or detergents to clean the glass substrate (e.g., glass substrate 110). For example, the surfactants may include one or both of Valtron SP2200 detergent (commercially available from Valtech Corporation of Pottstown, Pa.) and LiquiNox detergent (commercially available from Alcanox, Inc. of White Plains, N.Y.). The cleaning process may include the use of ultrasonic energy and temperature control to increase cleaning capabilities.

At a step 204, an etching process uses a controlled amount of a caustic solution with equipment having fluid and thermal control systems. The glass substrate may be exposed to the caustic solution for a predetermined amount of time and at a predetermined temperature. The caustic may be sodium hydroxide (NaOH) solution rather than the conventionally used and more difficult to control hydrofluoric or hydrochloric acid solution. For example, the caustic solution may include between about 50%-52% of NaOH (e.g., reagent grade) or may be an NaOH solution such as SS254-200 produced by Fisher Scientific. The caustic solution may be a part of an aqueous solution including about 2%-10% of the caustic solution (as controlled by the fluid control system).

At a step 206, an acid clean and final wash uses an acid solution to remove resultant glass residuals and/or surfactants of etching step 204 to leave the glass substrate in a final clean state. The etched glass substrate may be exposed to the acid solution for a predetermined amount of time at a predetermined temperature. The acid solution may be a nitric acid ($HNO_3$) solution, for example between about 70% and 75% reagent grade nitric acid. The acid solution may be part of an aqueous solution, for example including about 2%-4% of the acid. Without use of acid cleaning step 206, the glass substrate may include residuals and/or surfactants and appear cloudy or generally no longer be transparent.

Figure 3:
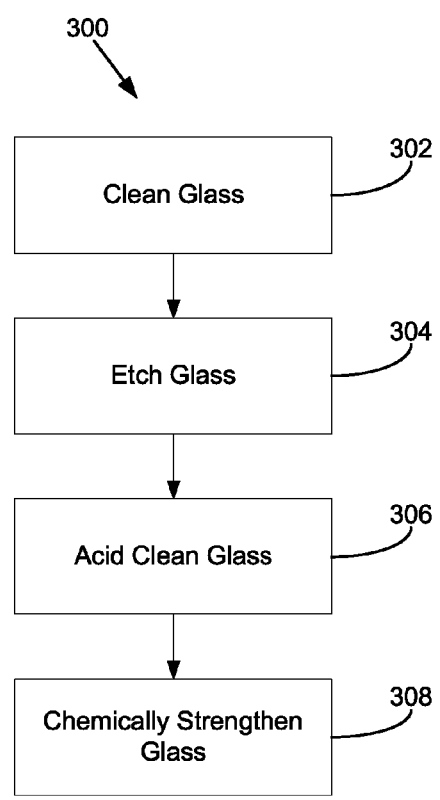
FIG. 3 is a flow chart of a glass texturing method or process according to another exemplary embodiment.

Referring to FIG. 3, process or method 300 for texturing or etching glass substrates (e.g., soda-lime-silica glass or soda-lime glass) is similar to method 200 and configured to reduce reduce specular reflectance and minimize diffuse reflectance and to maintain high transmission and high haze (the component of reflection that provides "image break-up"), according to an exemplary embodiment. Method 300 includes a step 302 for cleaning the glass, a step 304 for etching the glass, and a step 306 for acid cleaning the glass in a manner similar to steps 202, 204, and 206 of method 200.

Method 300 also includes a step 308 for chemically strengthening the etched glass (e.g., soda-lime glass). In applications where improved mechanical strength is desired, the etched substrate can be exposed to a chemical strengthening process where ions are exchanged to also provide a superior hard surface as compared to glass that is not chemically strengthened glass. For example, ions may penetrate up to about 50 microns into the substrate.

Figure 4:
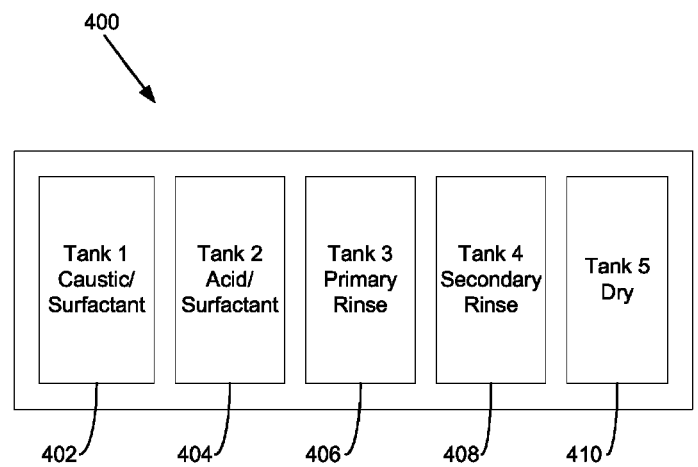
FIG. 4 is a block diagram of a glass texturing system according to an exemplary embodiment.

Referring to FIG. 4, a cleaning/texturing system 400 is configured to clean and texture the glass substrate according to methods 200 and 300 according to an exemplary embodiment. Cleaning/texturing system 400 generally includes five tanks that can be used both for cleaning processes (e.g., step 202 or 302) and etching/acid cleaning processes (e.g., steps 204, 206 or 304, 306).

During the cleaning process (e.g., step 202 or 302), a first tank 402 and a second tank 404 contain a surfactant such as a detergent. Tank 402 provides a first surfactant or detergent to the glass substrate and tank 404 provides a second surfactant or detergent. Tank 402 and tank 404 may include different surfactants (e.g., Valtron SP2200 and Liquinox) or the same surfactant. According to other exemplary embodiments, tank 402 or tank 404 may be omitted or skipped and cleaning/texturing system 400 may include or may use only one detergent tank. A third tank 406 is configured to rinse (e.g., a primary rinse) the glass substrate (e.g., using deionized water) after leaving tanks 402 and 404. A fourth tank 408 is configured to further rinse (e.g., a secondary rinse) the glass substrate and a fifth tank 410 is configured to dry the glass substrate after rinsing (e.g., using heating coils, blowers, etc).

During the etching and acid cleaning processes (e.g., steps 204, 206 or 304, 306), tank 402 contains a caustic solution (e.g., an NaOH solution) for etching the glass substrate and tank 404 contains an acid solution (e.g., a nitric acid solution) to remove resultant glass residuals and/or surfactants. Tank 406 is configured to rinse (e.g., a primary rinse) the etched and acid washed glass substrate (e.g., using deionized water) after the leaving tanks 402 and 404. A fourth tank 408 is configured to further rinse (e.g., a secondary rinse) the glass substrate and a fifth tank 410 is configured to dry the glass substrate after rinsing (e.g., using heating coils, blowers, etc).

Figure 5:
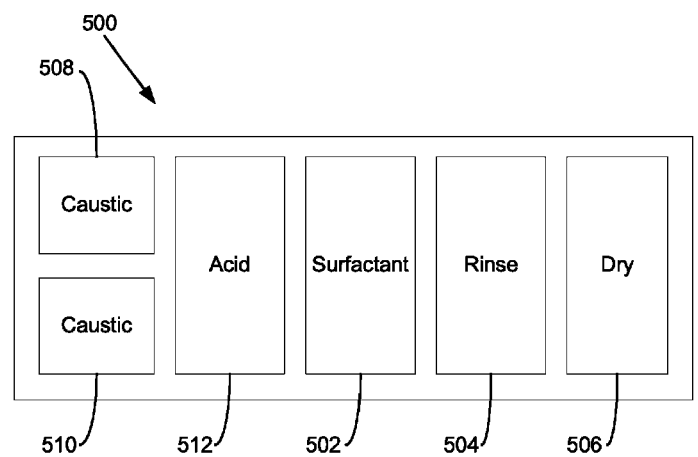
FIG. 5 is a block diagram of a glass texturing system according to another exemplary embodiment.

Referring to FIG. 5, a cleaning/texturing system 500 is configured to clean and texture the glass substrate according to methods 200 and 300 according to another exemplary embodiment. Cleaning/texturing system 500 generally includes five tanks that can be used both for cleaning processes (e.g., step 202 or 302) and etching/acid cleaning processes (e.g., steps 204, 206 or 304, 306).

During the cleaning process (e.g., step 202 or 302), a tank 502 contains a surfactant (e.g., a detergent or soap) provided to the glass substrate for cleaning. A tank 504 is configured to rinse the glass substrate (e.g., using deionized water) after leaving tank 502 and a tank 506 is configured to dry the glass substrate after rinsing (e.g., using heating coils, blowers, etc).

During the etching and acid cleaning processes (e.g., steps 204, 206 or 304, 306), tank 508 and 510 contain a caustic solution (e.g., an NaOH solution) for etching the glass substrate. Tanks 508 and 510 are generally configured in parallel to each other to etch glass substrates concurrently. A tank 512 contains an acid solution (e.g., a nitric acid solution) to remove resultant glass residuals and/or surfactants from one of caustic tanks 508 and 510. Tank 502 contains a surfactant (e.g., a detergent or soap) provided to the glass substrate for cleaning, tank 504 is configured to rinse the glass substrate (e.g., using deionized water) after the leaving tank 502, and tank 506 is configured to dry the glass substrate after rinsing (e.g., using heating coils, blowers, etc).

Figure 6:
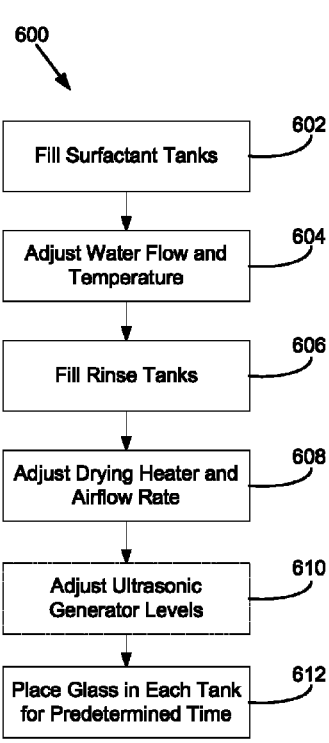
FIG. 6 is a flow chart of a glass cleaning method or process according to some exemplary embodiments.

Referring to FIG. 6, a method 600 describes the cleaning process (e.g., step 202 or 302) in more detail according to one exemplary embodiment referencing cleaning/texturing system 400. At step 602, tank 402 and/or tank 404 are filled with water (e.g., deionized water) so that they heat up at about the same rate. For example, the water supply may be shut-off after tanks 402 and 404 are about half full. A surfactant (e.g., Valtron SP 2200) is then added to tank 402, for example to form a solution containing between about 1% and 2% of the surfactant, between about 1.2% and 1.5% of the surfactant, about 1.3% of the surfactant (e.g., about 430 mL for about 33

L of water), etc. A surfactant (e.g., Liquinox) is then added to tank 404, for example to form a solution containing between about 0.5% and 1.5% of the surfactant, between about 0.75% and 1.25% of the surfactant, about 1% of the surfactant (e.g., about 330 mL for about 33 L of water), etc. It is noted that while exemplary ranges of surfactants are given, according to other exemplary embodiments, other amounts of surfactants may be used depending on the depth of etching desired and other amounts of water may be used. The remainder of tanks 402 and 404 may be filled with DI water. It is noted that according to other exemplary embodiments, tank 404 or filling of tank 404 may be omitted.

At step 604 and with tanks 402 and/or 404 full, circulating pumps and heaters are turned on. According to various exemplary embodiments, the heater may be set at a temperature between about 80° C. and 100° C., between about 85° C. and 95° C., at about 90° C., etc. According to various exemplary embodiments, flow rate valves on the circulating pumps for a tank for holding about 33 L of water may be opened to between 2 and 3 gallons per minute (GPM), for example 2.5 GPM for tank 404 and between about 1 and 2 GPM, for example 1.5 GPM, for tank 402. Tanks 402 and 404 may then be allowed to reach the set temperature. The water flow meters may then be set to about 2.25 GPM and a heat for the water supply may be switched on. According to various other exemplary embodiments, other flow rates and other tank sizes may be used.

At step 606, tanks 406 and 408 (rinse tanks) are filled with water (e.g., deionized water) for rinsing. At step 608, a heater for the dryer of tank 410 is turned on, for example between about 60° C. and 100° C., between about 70° C. and 90° C., between about 75° C. and 85° C., to about 80° C., etc. The airflow rate of tank 610 may then be adjusted, for example to an average or medium operating level.

At step 610, when both tanks 402 and 404 (if both are used) have reached the set temperature, ultrasonic frequency levels of ultrasonic generators for tanks 402, 404, and 406 may be adjusted, for example to about 25% for tank 402, to about 40% for tank 404, and to about 35% for tank 406. The ultrasonic generators may be any ultrasonic generator capable of aiding in cleaning of glass substrates, for example GS-4500 models capable of 40 kilohertz (kHz) and available from Interlab, Inc. of Danbury, Conn. It is noted that according to various exemplary embodiments, use of ultrasonic generators may be omitted. According to still other exemplary embodiments, other systems may be used to aid in cleaning of glass substrates.

At step 612, the glass substrates, for example on a loaded rack, are placed in the various tanks of cleaning/etching system 400. The glass substrate may initially be placed in tank 402 for about two minutes of cleaning, followed by tank 404 (if used) for about two minutes of cleaning, followed by tank 406 for about two minutes of primary rinsing, followed by tank 408 for about two minutes of secondary rinsing, followed by tank 410 for about eight minutes of drying. If soap residue is present after tank 408, the glass may be re-rinsed in tank 408. It is noted that while approximate times for each tank have been given, according to other exemplary embodiments, other times may be used, for example between about 1 and 3 minutes or greater for tanks 402, 404, 406, and 408 and between about 5 and 10 minutes or greater for tank 410. The times given above are by way of example only and according to other exemplary embodiments, other time periods may be used.

It is noted that while the cleaning process was described with reference to cleaning/texturing system 400, according to other exemplary embodiments, cleaning/texturing system 500 or another system may also be used. It is also noted that according to other exemplary embodiments, method 600 may be altered as long as the glass substrate is cleaned. For example, different numbers of tanks may be used, tanks may be filled at different times than described, water and air flow may be adjusted other than described, other amounts or types of detergent may be used, etc.

After the tanks of system 400 are finished cleaning glass substrates, they may be flushed and cleaned in preparation for the etching and acid cleaning processes. Alternatively, a different system may be used for the etching and acid cleaning.

Figure 7:
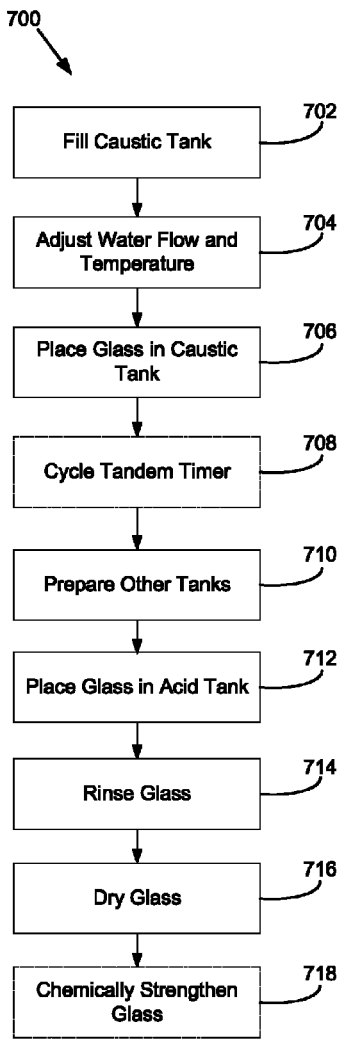
FIG. 7 is a block diagram of a glass etching method or process according to some exemplary embodiments.

Referring to FIG. 7, a method 700 describes the etching and acid cleaning process (e.g., step 202 or 302) in more detail according to one exemplary embodiment referencing cleaning/texturing system 400.

At step 702, tank 402 is filled with water, for example approximately half full with deionized water. Sodium hydroxide (NaOH) may then be added, for example between about 3000 L and 4000 L per each 30-35 L of water, between about 3250 mL and 3750 L per 30-35 L of water, between about 3500 L and 3600 L per 30-35 L of water, about 3559 L±10 L per about 33 L of water. It is noted that while exemplary ranges of surfactants are given, according to other exemplary embodiments, other amounts of surfactants may be used depending on the depth of etching desired and other amounts of water may be used. The remainder of tank 402 may then be filled with water, for example to a level appropriate so the tank does not overflow when glass is added.

At step 704 and with tank 402 full and water flow control open, the circulating pump can and heaters can be turned on to allow tank 402 to reach a constant temperature, for example between about 80° C. and 110° C., between about 90° C. and 100° C., or about 95° C. The water flow control is generally dependent on the machine used or the glass used. For example, the water flow can be between about 1 GPM and 10 GPM, between about 2 GPM and 5 GPM, about 3 GPM, etc. The circulating pump is generally turned off to allow the solution to settle, for example for about two minutes, to prevent or reduce the likelihood that the flow lines are etched into the glass substrates. However, some glass materials are not affected by the flow lines and in various exemplary embodiments where such materials are used, settling may be omitted.

At step 706, the glass, for example a rack of glass, is added to the NaOH solution. The glass should be added within about one hour after the NaOH is added to tank 402 and maintained at a specified temperature. The glass is generally in tank 402 for about 14 hours, but can be in tank 402 for more or less exposure time.

At optional step 708, for some glass types and machine types a tandem recycling timer may be used. For example the tandem timer may be set to about six minutes "on" for timer one and about four minutes "off" for timer two. The circulating pumps then alternate between on and off according to the set timers. This cycling may prevent or reduce the likelihood of etched flow lines in certain glass types.

At step 710, tanks 404, 406, 408, and 410 are prepared. For example, approximately one half-hour before the glass is to be removed from the NaOH solution, tanks 404, 406, 408, and 410 may be prepared. Tank 404 is generally operated at about 2% $HNO_3$ (e.g., between about 650 and 700 mL per 33000-33500 mL water, about 680 mL per about 33000 mL water, etc.) with maximum flow. Tank 404 is filled approximately half full with deionized water and the $HNO_3$ is added. The remainder of tank 404 is filled with water to an appropriate level so the tank does not overflow when the glass is added.

With tank 404 full, the associated circulating pump may be turned on, for example at maximum flow.

Tanks 406 and 408 are filled with water for rinsing. For example, tank 406 may be filled from a drain of tank 408. Water flow can be set (e.g., about 2 GPM) for tank 408 to also flow through tank 406. Alternatively, tanks 406 and 408 may have their own circulating pumps. The water heater for tank 408 or a heater for each of tanks 406 and 408 may then be turned on. The heater for tank 410 may be set to about 80° C. or any other appropriate temperature for drying. After a predetermined amount of time (e.g., less than an hour, about one half hour, about 20 minutes, etc.), the water flow and heater for tanks 406 and 408 may be turned off. Liquinox (e.g., between about 100 mL to 200 mL, between about 150 mL and 175 mL, about 165 mL, etc. per 33 L of water) is then added to tank 406. The ultrasonic generator on tank 406 (if present) may also be turned on for approximately three minutes to mix the Liquinox and reduce bubbles.

At step 712 and after about 14 hours (or other predetermined exposure time), the glass is immersed in tank 404 upon removal from tank 402. The immersion should occur as quickly as possible so residuals are not allowed to dry on the glass panels. The glass is immersed in tank 404 for between about 3 and 10 minutes, for example about 5 minutes. The heaters and circulating pump for tank 402 can then be turned off as well as the tandem recycling timer (if used).

At step 714, after immersion in tank 404 is complete, the glass is placed into tank 406 for about two minutes and then placed in tank 408 for about two minutes for rinsing. At step 716, the glass is placed in tank 410 for drying. The circulating pump for tank 404 can be turned off. After about eight minutes, the glass may be ready to be removed from tank 410. At optional step 718, the etched and acid cleaned glass can be chemically strengthened using any chemical strengthening process of past, present, or future design.

It is noted that while the cleaning process was described with reference to cleaning/texturing system 400, according to other exemplary embodiments, cleaning/texturing system 500 or another system may also be used. It is also noted that according to other exemplary embodiments, method 700 may be altered as long as a glass substrate of less than about 0.7 mm is capable of being etched and acid cleaned in a controllable fashion. For example, different numbers of tanks may be used, tanks may be filled at different times than described, water and air flow may be adjusted other than described, other amounts or types of detergent or acid may be used, etc.

As utilized herein, the terms "approximately," "about," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It is also important to note that the construction and arrangement of the components as shown in the various exemplary embodiments is illustrative only. Although only a few embodiments have been described in detail in this disclosure, those skilled in the art who review this disclosure will readily appreciate that many modifications are possible (e.g., variations in temperatures, exposure times, sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may be made in the design, operating conditions and arrangement of the various exemplary embodiments without departing from the scope of the present inventions as expressed in the appended claims.

What is claimed is:

1. A method for texturing a glass substrate, comprising:
   cleaning the glass substrate with at least one surfactant; then
   etching the glass substrate using a caustic solution, the percentage of caustic solution being provided by controlling a fluid flow and temperature to control the depth of the etching; and then
   acid cleaning the etched glass substrate to remove glass residuals and surfactants.

2. The method of claim 1, further comprising:
   chemically strengthening the etched and cleaned substrate.

3. The method of claim 1, wherein cleaning the glass substrate comprises using multiple surfactants and controlling ultrasonic energy and temperature.

4. The method of claim 1, wherein the etching and acid cleaning of the glass substrate reduce specular and diffuse reflectance while increasing haze reflectance of the glass substrate.

5. The method of claim 1, wherein the glass substrate comprises a soda lime silica glass or a soda lime glass.

6. The method of claim 1, wherein the acid comprises a solution of nitric acid.

7. The method of claim 1, wherein the caustic solution comprises a solution of sodium hydroxide.

8. The method of claim 1, wherein the caustic solution comprises 2% to 10% of caustic.

9. The method of claim 1, wherein the glass substrate is less than 0.7 millimeters thick.

10. The method of claim 1, wherein the glass substrate is less than 0.5 millimeters thick.

* * * * *